(12) United States Patent
Schmezer (10) Patent No.: US 11,892,369 B2
(45) Date of Patent: Feb. 6, 2024

(54) METHOD FOR EVALUATING THE OPERATIONAL READINESS OF AN ELECTRIC MOTOR, ELECTRIC MOTOR, AND VENTILATOR

(71) Applicant: ZIEHL-ABEGG SE, Künzelsau (DE)

(72) Inventor: Joachim Schmezer, Niedernhall (DE)

(73) Assignee: ZIEHL-ABEGG SE, Künzelsau (DE)

( * ) Notice: Subject to any disclaimer, the term of this patent is extended or adjusted under 35 U.S.C. 154(b) by 262 days.

(21) Appl. No.: 17/260,368

(22) PCT Filed: Jun. 4, 2019

(86) PCT No.: PCT/DE2019/200059
§ 371 (c)(1),
(2) Date: Jan. 14, 2021

(87) PCT Pub. No.: WO2020/015798
PCT Pub. Date: Jan. 23, 2020

(65) Prior Publication Data
US 2021/0278316 A1  Sep. 9, 2021

(30) Foreign Application Priority Data

Jul. 17, 2018  (DE) .......................... 102018211850.7

(51) Int. Cl.
*G01M 13/045* (2019.01)
*G01R 31/34* (2020.01)
*G08B 5/36* (2006.01)

(52) U.S. Cl.
CPC ......... *G01M 13/045* (2013.01); *G01R 31/343* (2013.01); *G08B 5/36* (2013.01)

(58) Field of Classification Search
CPC ..... G01M 13/045; G01R 31/343; G08B 5/36; H02P 1/04; H02P 23/04; H02P 23/14; H02P 29/024
See application file for complete search history.

(56) References Cited

U.S. PATENT DOCUMENTS 3,742,267 A * 6/1973 Papst ................... G01R 31/343
310/67 R
6,100,656 A * 8/2000 El-Sadi ..................... H02P 6/20
318/400.11
(Continued)

FOREIGN PATENT DOCUMENTS

CN     1140211     1/1997
CN     1246921     3/2000
(Continued)

*Primary Examiner* — Natalie Huls
*Assistant Examiner* — Cynthia L Davis
(74) *Attorney, Agent, or Firm* — FisherBroyles, LLP; Jason P. Mueller (57) ABSTRACT

A method is disclosed for evaluating an operational readiness of an electric motor, such as an electric motor of a fan. The method includes: initiating a run-up process of the electric motor, the speed being changed in several speed levels during the run-up process, generating at least one measured value by measuring a physical variable with a sensor of the electric motor in at least one of the speed levels, loading at least one parameter datum from a parameter memory of the electric motor, wherein the at least one parameter datum corresponds to the at least one measured value generated, and evaluating the at least one measured value for at least one of the speed levels using the at least one loaded parameter datum. Further disclosed are an electric motor with a parameter memory and a parameterization interface as well as a fan with this electric motor and an impeller.

23 Claims, 3 Drawing Sheets

(56) References Cited

U.S. PATENT DOCUMENTS

| | | |
|---|---|---|
| 2011/0314875 A1 | 12/2011 | Albayrak |
| 2013/0106335 A1 | 5/2013 | Uusi-Äijö |
| 2021/0320565 A1* | 10/2021 | Schmezer .............. G01H 1/003 |

FOREIGN PATENT DOCUMENTS

| | | | |
|---|---|---|---|
| CN | 101023266 | 8/2007 | |
| CN | 101443718 | 5/2009 | |
| CN | 101755221 | 6/2010 | |
| CN | 105008944 | 10/2015 | |
| CN | 107112942 | 8/2017 | |
| CN | 108169672 | 6/2018 | |
| DE | 19610189 A1 * | 10/1996 | ........... D06F 37/203 |
| DE | 19702234 A1 | 8/1998 | |
| DE | 102008001714 | 11/2009 | |
| DE | 102008025596 A1 | 2/2010 | |
| DE | 102009026943 | 12/2010 | |
| DE | 102013102648 A1 | 9/2014 | |
| DE | 202017100915 | 7/2017 | |
| DE | 102019201409 | 8/2019 | |
| DE | 102018211833 | 1/2020 | |
| DE | 102018211838 | 1/2020 | |
| DE | 102018211843 | 1/2020 | |
| DE | 102018211846 | 1/2020 | |
| EP | 2972431 | 1/2016 | |
| EP | 2875234 A4 | 7/2016 | |
| FR | 2799550 A1 | 4/2001 | |
| FR | 2999326 B1 | 1/2017 | |
| JP | H08266789 | 10/1996 | |
| JP | 2006161677 A | 6/2006 | |
| JP | 2018084407 A | 5/2018 | |
| RU | 2379205 C1 | 1/2010 | |
| RU | 2456629 C1 | 7/2012 | |
| RU | 2622493 C1 | 6/2017 | |
| WO | 1999047904 A1 | 9/1999 | |
| WO | WO-9947904 A1 * | 9/1999 | ........... G01M 13/04 |
| WO | 02089305 | 11/2002 | |
| WO | 2014207242 A1 | 12/2014 | |
| WO | 2016103909 | 6/2016 | |

* cited by examiner

METHOD FOR EVALUATING THE OPERATIONAL READINESS OF AN ELECTRIC MOTOR, ELECTRIC MOTOR, AND VENTILATOR

This application is a national stage entry under 35 U.S.C. 371 of PCT Patent Application No. PCT/DE2019/200059, filed Jun. 4, 2019, which claims priority to German Patent Application No. 10 2018 211 850.7, filed Jul. 17, 2018, the entire contents of each of which are incorporated herein by reference.

The disclosure relates to a method for evaluating an operational readiness of an electric motor, such as an electric motor of a fan, e.g., during initial start-up. The disclosure also relates to an electric motor and a fan.

Electric motors are exposed to various types of vibrations during their operation. These vibrations can be caused by the electric motor itself, by the driven load, or by the environment in which the electric motor is installed. If the electric motor is part of a fan, for example, an imbalance in the impeller can generate vibration. In addition, a non-uniform drive torque, which can arise, for example, from a pulsating DC link voltage, can further intensify the vibrations. If the fan is installed in an industrial environment that transmits vibrations to the fan, the fan is exposed to further vibrations.

Motors and/or fans are usually dynamically balanced before delivery to the customer or before installation in a housing in that asymmetrical weight distributions or other vibration-generating circumstances are reduced. However, damage can occur during installation in a housing, during transport to the customer, during installation in a customer application, or at the end customer, which can impair the balance quality. If a fan is operated in environments with adhering contamination, such as in agriculture or in highly corrosive environmental conditions, the balance quality is also impaired over the service life of the fan.

Imbalances lead to increased vibrations, which in turn place a heavy load on the components of the electric motor. For example, the bearings are subjected to considerably more stress from vibrations than would be the case with a less vibrating system. On the other hand, the vibrations put a strain on electronics that are integrated in the electric motor. This can lead to loosening of soldered connections, destruction of components, or even breakage of circuit boards. Overall, a high level of vibrations can result in the service life of the electric motor and/or its components being significantly reduced.

EP 2 972 431 B1 discloses an electric motor with function monitoring of the motor bearings. For this purpose, a vibration sensor is attached to the stator flange on its side facing away from the rotor, and it measures vibrations of the electric motor. In this way, problems which arise with the bearing of the electric motor can be detected. However, problems are only recognized when they are at a relatively advanced level.

The present disclosure is therefore based on the object of designing and developing a method, an electric motor, and a fan of the type mentioned at the beginning in such a way that safe and reliable operation can be ensured.

According to some embodiments, a method includes:
Initiating a run-up process of the electric motor, the speed being changed in several speed levels during the run-up process;
Generating at least one measured value by measuring a physical variable with a sensor of the electric motor in at least one of the speed levels;
Loading at least one parameter datum from a parameter memory of the electric motor, the at least one parameter datum corresponding to the generated at least one measured value; and
Evaluating the at least one measured value for at least one of the speed levels using the at least one loaded parameter datum.

According to some embodiments, an electric motor, which may be configured to carry out the method as disclosed herein, includes a parameter memory and an interface for transmitting parameter data, the parameter memory being designed to store parameter data transmitted via the interface during a parameterization process.

According to some embodiments, a fan may include an electric motor and an impeller, the impeller being connected to a rotor of the electric motor.

In a manner according to the disclosure, it was first recognized that in many cases problems that arise appear very early on. When an electric motor is started up for the first time, it is possible to estimate whether and how long an electric motor can be operated under the current operating conditions. Therefore, according to some embodiments, the operational readiness of an electric motor is evaluated, and this may occur when the electric motor is first started up after delivery and installation in the operating environment.

So that such a check of the operational readiness of the electric motor is possible, the electric motor is provided with parameter data that allow an evaluation of the operation of the electric motor. These parameter data go beyond the parameters usually present in the electric motor, such as a nominal speed or a nominal torque. This is because the parameter data can provide extensive information about the design of the electric motor and its installation and operating conditions. The parameter data can include reference values, design information about the electric motor, design information about a load operated by the electric motor (for example the impeller of a fan), characteristics of the electric motor, characteristics of components, and/or information about the operating behavior of the electric motor. These parameter data are used in the method disclosed herein for evaluating the operational readiness of the electric motor in order to evaluate generated measured values. The evaluation of the measured values in turn provides conclusions as to whether the electric motor is overall ready for operation.

According to some embodiments, a run-up process of the electric motor is first initiated. During the run-up process, the speed is changed in several speed levels. In principle, it is not important how the speed is changed. The speed can be changed in ascending or descending order. It is even conceivable that the speed jumps relatively arbitrarily between values of different magnitude. It is only important that the electric motor is operated at several speeds in order to be able to evaluate the behavior of the electric motor at different speeds. Since the electric motor is usually stopped when a supply voltage is applied and thus a speed of zero will be present, the speed may be changed from a lower speed to an upper speed. In this case, the lower speed may be formed by a speed equal to zero—the electric motor is stopped—and the upper speed may be formed by a nominal speed of the electric motor. When the speed is changed, the speed levels can be equidistant from one another. However, it is also possible that the intervals between speed levels do not further correlate with one another. To avoid unnecessary loading of the electric motor due to changing from one speed to the next, it is advisable if the speed is changed continuously or quasi-continuously between the speed levels.

In a further step, at least one measured value is generated. The measured value or each of the measured values is created by measuring a physical variable with a sensor of the electric motor in at least one of the speed levels. This means that, in the case of several measured values, one physical variable is measured with one sensor at several speed levels, or one physical variable is measured with several sensors at one or more speeds, or several physical variables are measured with several sensors at one or more speed levels. The type of evaluation of the operational readiness determines which physical variables that can in principle be measured in the electric motor are measured. The respective physical variables are recorded by at least one sensor of the electric motor. A "sensor of the electric motor" can be any sensor that is integrated in the electric motor or in the electronics of the electric motor. In principle, this can also include a sensor which is integrated in the motor electronics attached to the outside of the electric motor, for example motor electronics flanged to the motor housing.

In a further step, at least one parameter datum is loaded from a parameter memory of the electric motor. The parameter data may be transferred to the parameter memory during a parameterization process and stored there. This parameterization process will be discussed in more detail below. With regard to the at least one parameter datum, it is important that the parameter datum loaded in each case corresponds directly or indirectly to the respective measured value generated. A parameter datum can, for example, correspond directly to the measured value if the measured value indicates a vibration of the electric motor, and the parameter datum indicates a maximum permissible vibration. The parameter datum should mostly relate to the same physical variable as the measured value. An indirectly corresponding parameter datum can be formed, for example, using design information about the electric motor or dimensions of the electric motor. Such parameter data can have an indirect influence on a measured variable. For example, dimensions of the electric motor can have an influence on vibrations of the electric motor, so that this parameter datum corresponds indirectly to a measured vibration value. Selecting corresponding parameter data ensures that an evaluation of the generated measured value is possible using the loaded parameter datum.

Using the at least one loaded parameter datum, an evaluation of the at least one measured value is carried out in a further step. This evaluation can include, for example, compliance with a limit value. However, it is also conceivable to check whether the measured value generated can match the geometric information specified in the parameter datum or whether, for example, a subsequent change has been made to the electric motor or the load connected to the electric motor or whether the electric motor has been damaged during transport.

The "physical variable" can be formed by different variables within the electric motor. In principle, this can also include a voltage or a current through a coil of the stator or the rotor. According to some embodiments, however, these physical variables relate to mechanical variables and/or magnetic variables and/or a temperature. Examples of such physical variables, but not limited to these, are the speed of the rotor of the electric motor, vibrations, accelerations, pressure differences, and/or angles of inclination. The respective sensor is also designed depending on the physical variable measured. For example, accelerations can be recorded with an acceleration sensor, pressure differences with a pressure sensor or a microphone, and temperatures with a temperature sensor. It is also conceivable that several sensors detect a physical variable, for example at different points on the electric motor.

The meaning of the term "operational readiness" of the electric motor will depend on various conditions. For example, the electric motor may have been installed in an impermissible spatial orientation that leads to excessive bearing stress or excessive stress on the rotor or the load connected to the rotor. This can significantly reduce the service life of the electric motor. In this case, the electric motor can in principle be operated, but a general operational readiness must be addressed. It would also be conceivable that the electric motor is exposed to very high vibrational stress during its operation, which likewise does not guarantee safe operation. However, there could also be a lack of operational readiness if the electric motor is part of a fan and flow disruptions can be observed on the impeller. This indicates an unfavorable dimensioning of the fan or the operating environment and can lead to cracks on the blades of the fan. Operational readiness can also be denied in this case. This short and exemplary list shows what can be understood by the term "operational readiness."

To avoid undefined vibrational states during the measurement of the physical variable, it is advisable if the measurement(s) is/are carried out in a largely steady system. Therefore, in a refinement of the method, there may be a check before the at least one measured value is generated as to whether the speed of the electric motor has reached a set speed level or whether the speed is still moving in the direction of the set speed level. This means that, for example, if a set speed level of 97 RPMs is specified, there is a check to determine whether the speed is actually 97 RPMs or whether the speed of the electric motor is currently still being changed in the direction of the set speed level. Reaching a set speed level ensures, on the one hand, that loaded speed-dependent parameter data can actually be used for a reliable evaluation of a measured value. On the other hand, the electric motor is then usually no longer in an intermediate state in which the measured values are impaired by transient processes.

In one refinement, in the step of evaluating the at least one measured value, there is a check to determine whether a predefined boundary condition is being met. Such a boundary condition can be, for example, a limit value above which safe operation of the electric motor cannot be guaranteed. If such or a similar boundary condition is not met, a warning message can be issued and/or the process can be terminated. The warning message can be issued in a wide variety of ways. It is conceivable, for example, that an LED (light-emitting diode) lights up and thereby indicates a fault. Since the electric motor is likely to be connected to a programming device or a control computer, such as when it is first started up, such a warning message can also be output to this programming device or this control computer. In this case, the person performing the setup can react immediately to the warning message.

In another refinement, the method additionally includes a step of estimating a bearing service life, with several parameter data being loaded and/or several measurement values being measured and combined with one another during the estimate of the bearing service life. During initial start-up, for example, the estimated bearing service life can then be stored as an initial value in a memory, for example the parameter memory. It can be assumed that the electric motor is being operated under the currently existing operating conditions for the entire service life of the bearing. These operating conditions can include, for example, an operating temperature, vibration stress, and/or an installation position of the electric motor. In addition, increasing wear of components of the electric motor can be taken into account when estimating the bearing service life. An electric motor will generate more vibrations than a brand-new electric motor as the bearings become increasingly worn. The increasing vibration stress in turn leads to a reduction in the bearing service life. This can be taken into account when estimating the bearing service life, since the behavior with increasing wear can be estimated relatively well.

In another refinement, the step of generating at least one measured value, the step of loading at least one parameter datum, and the step of evaluating the at least one measured value are carried out for each of the several speed levels. In this way, a comprehensive picture of the operational readiness of the electric motor can be generated. The sequence does not necessarily have to be adhered to for all steps and all measured values. Thus, it is conceivable that all measured values are initially recorded for all speed levels and only then an evaluation of the measured values takes place. However, since individual measured values, such as vibration stress, can also be relevant for setting the next speed level, individual measured values or all measured values can also be evaluated immediately after the recording.

In the step of generating the at least one measured value, an acceleration and/or a speed of a vibration of the electric motor can be measured by a vibration sensor of the electric motor, and a vibration value can be generated therefrom. Arrangements with which such a vibration measurement is possible are disclosed, for example, in DE 10 2018 211 838 A1 and DE 10 2018 211 833 A1, the respective content of which is hereby expressly referred to.

When generating the vibration value, the vibrations can also be measured at a speed equal to zero, which corresponds to a stopped electric motor. This means that the rotor does not move, or only moves insignificantly, relative to the stator and about the rotor axis. As a result, the electric motor itself cannot generate any vibrations that can be measured by the vibration sensor of the electric motor. However, in this way it can be checked whether and to what extent vibrations from the installation environment of the electric motor are coupled into the electric motor. It is not uncommon for these coupled-in vibrations of the installation environment to be so significant that the additional vibrations of the electric motor during its operation result in excessive vibration stress on the electric motor. By evaluating the vibrations at a speed of zero, this unsafe operation of the electric motor can be recognized even before the start of operation.

Regardless of the selected speed level, in the step of loading the at least one parameter datum, a maximum permissible vibration can be loaded as a parameter datum corresponding to the vibration value. The maximum permissible vibration would then be compared with the generated vibration value in the step of evaluating the measured value. In this way, it can be determined whether the electric motor has such large vibrations at a given speed that safe operation of the electric motor is not guaranteed. In this case, there can be no discussion of the operational readiness of the electric motor, since operation of the electric motor could lead to premature damage to the electric motor or to the load driven by the electric motor.

Additionally or alternatively, in the step of loading the at least one parameter datum, a vibration value that was generated during a calibration measurement of the electric motor, for example during its final test, can be loaded for the current rotational speed. This means that the parameter data contain vibration values from a calibration measurement—hereinafter also referred to as calibration values—at different speeds and that a calibration value that corresponds to the current speed of the electric motor is loaded and compared with the currently measured vibration value. The calibration value and the currently measured vibration value should only deviate insignificantly from one another. If the deviation exceeds a specified amount, it can be concluded that damage has occurred.

In a refinement of this embodiment, vibrations in the installation environment can be taken into account when comparing the calibration value with the currently measured vibration value. A first vibration value would be determined when the electric motor is stopped, and a second vibration value would be determined at a non-zero speed. The first vibration value represents the vibrations of the installation environment. The second vibration value relates to vibrations that result from a superposition of the vibrations of the installation environment and the vibrations of the electric motor. When evaluating the second vibration value, the first vibration value can then be subtracted from the second vibration value and compared with a calibration value. If the difference between the first and second vibration values deviates from the calibration value by a predetermined amount, it can be concluded that damage has occurred. Such damage can be caused, for example, by improper transport or—if the electric motor is part of a fan—by a blade of the fan becoming bent.

In another embodiment of the step of generating the at least one measured value, which can be used in addition or as an alternative, the spatial orientation of the electric motor can be determined. Such a method is disclosed, for example, in DE 10 2018 211 843 A1, the content of which is hereby expressly referred to.

A parameter datum corresponding to this measured value can include a permissible range of a spatial orientation of the electric motor. Such a permissible range would then be loaded in the step of loading the at least one parameter datum and used during the step of evaluating the measured value to check the installation position of the electric motor. In this case, it can be checked whether the spatial orientation of the electric motor is within the permissible range. The permissible range can include individual discrete orientations. For example, the parameter datum can indicate that only a horizontal installation position is permitted. Since it is likely to be difficult to meet the requirement of an absolutely horizontal installation position, it is also advisable to specify an orientation range for discrete spatial orientations. For example, an angular range of ±2° could be permitted if a horizontal installation position is required.

An electric motor may be configured to carry out the method disclosed herein, has a parameter memory and an interface for the transmission of parameter data. The parameter memory is designed to store parameter data. The interface is connected to the parameter memory in such a way that parameter data transmitted via the interface can be stored in the parameter memory. For this purpose, for example, a microprocessor can be provided which controls communication via the interface and stores parameter data received via the interface in the parameter memory. The parameter memory can be designed as a dedicated memory that only stores parameter data. Since further data usually have to be stored within motor electronics, the parameter memory can also be a part of a larger memory. The parameter memory should be a non-volatile memory. Since the parameter data are usually permanently linked to the electric motor and therefore the parameter data should not change during the service life of the electric motor, the parameter memory can in principle even be designed as a non-changeable memory. According to some embodiments, however, the content of the non-volatile memory can be changed. Purely by way of example, but not limited to these, reference is made to the use of flash memories, EEPROM (Electronically Erasable Programmable Read-Only Memory), NVRAM (Non-Volatile Random Access Memory), or other semiconductor memories.

A system in which parameter data can be transferred to the electric motor and stored there is disclosed, for example, in DE 10 2018 211 846 A1, the content of which is hereby also expressly referred to. The parameter data transferred there are reference values that can be used to evaluate the measured values of a motor-internal vibration sensor. However, this system can also be used to transmit further parameter data.

The parameter data stored in the parameter memory can also be stored in a database that can be operated, for example, by the manufacturer of the electric motor. This may be implemented when the parameter data are transferred to the electric motor during a final test and/or a calibration measurement. A data record in such a database can represent a "digital twin" of the electric motor, which contains all relevant information about the electric motor and/or its operating behavior. Such a database system is described, for example, in DE 10 2018 201 707 A1, the content of which is hereby expressly referred to.

If such a database is in use, results from the evaluation method can be loaded into the database. For example, it is conceivable that information about the vibration behavior of the installation environment, the installation position of the electric motor, an initial value for the bearing service life, or results of an evaluation of measured values are added to a "digital twin." The interface of the electric motor can be used for this. This additional information can be transferred to the database via a wide-area-network interface. When a programming device or a control computer is used, it is also possible that the additional information is first collected in the programming device or the control computer and then transferred to the database during initial start-up. A wide-area network can again be used for this, or a mass storage device such as a USB stick can be used. In the latter case, the information stored in the mass storage device would be imported into the database in a further step.

The parameter data can, in principle, include a wide variety of information that describes the electric motor and a load connected (permanently) to the electric motor. An example would be a center of gravity of the electric motor or parts of the electric motor and/or a mass of the electric motor or parts of the electric motor and/or bearing adjustment forces and/or characteristic data of the bearing and/or a maximum permissible imbalance of the electric motor and/or geometric data of the electric motor and/or a permissible range of spatial orientations of the electric motor and/or a maximum permissible rotational speed of the electric motor and/or a characteristic curve of the magnetic attraction between the stator and rotor of the electric motor.

"Bearing adjustment forces" refer to axial forces that act on the bearing. These forces ensure that the rolling elements of the bearing, mostly balls, actually roll between the inner and outer ring of the bearing and do not slide through between the rings. As the rolling elements roll, the friction remains low during operation of the bearing. However, if the bearing adjustment forces are too great, the wear on the bearing increases, which in turn reduces the service life of the bearing. Such a parameter datum thus supports the estimation of the bearing service life.

"Characteristic data of the bearing" can include, for example, dimensions of the bearing (diameter of the outer ring, diameter of the rolling elements, inner diameter of the inner ring, width of the bearing, etc.), bearing clearance, load ratings, and/or other calculation factors of the bearing. However, this can also include additional features of the bearing, such as whether the bearing has a cover ring or a Nilos ring or which greasing is used for the bearing. Such characteristics can usually be found in the data sheet of the bearing. The characteristic data of the bearing can, however, also include a date of manufacture of the bearing, which is may be used to estimate the service life of the lubricant.

The electric motor can be part of a fan, for which purpose an impeller is connected to a rotor of the electric motor. In most cases, the impeller and electric motor are already connected during production, so that it is very precisely known how the fan behaves. In some embodiments, it is also known which load—the impeller—is being driven by the electric motor and the properties thereof. In this case, the parameter data can additionally include a maximum permissible imbalance of the fan and/or geometric data of the impeller and/or information about the design of the impeller and/or an axial thrust speed characteristic and/or further information about the impeller.

"Axial thrust" describes the force on the blades of the fan that is created by the movement of the air through the blades. The axial thrust is therefore related to the air pressure that acts on the blades. The axial thrust is a variable that depends on the rotational speed. The greater the axial thrust, the more the bearings are loaded in the longitudinal direction of the shaft. This in turn has an impact on the service life of the bearings.

There are various options for advantageously designing and refining the teaching of the present disclosure. For this purpose, reference is made, on the one hand, to the claims subordinate to the ancillary claims and, on the other hand, to the following explanation of exemplary embodiments with reference to the drawings. In connection with the explanation of various exemplary embodiments with reference to the drawings, various designs and refinements of the teaching are also explained. The figures show the following:

Figure 1:
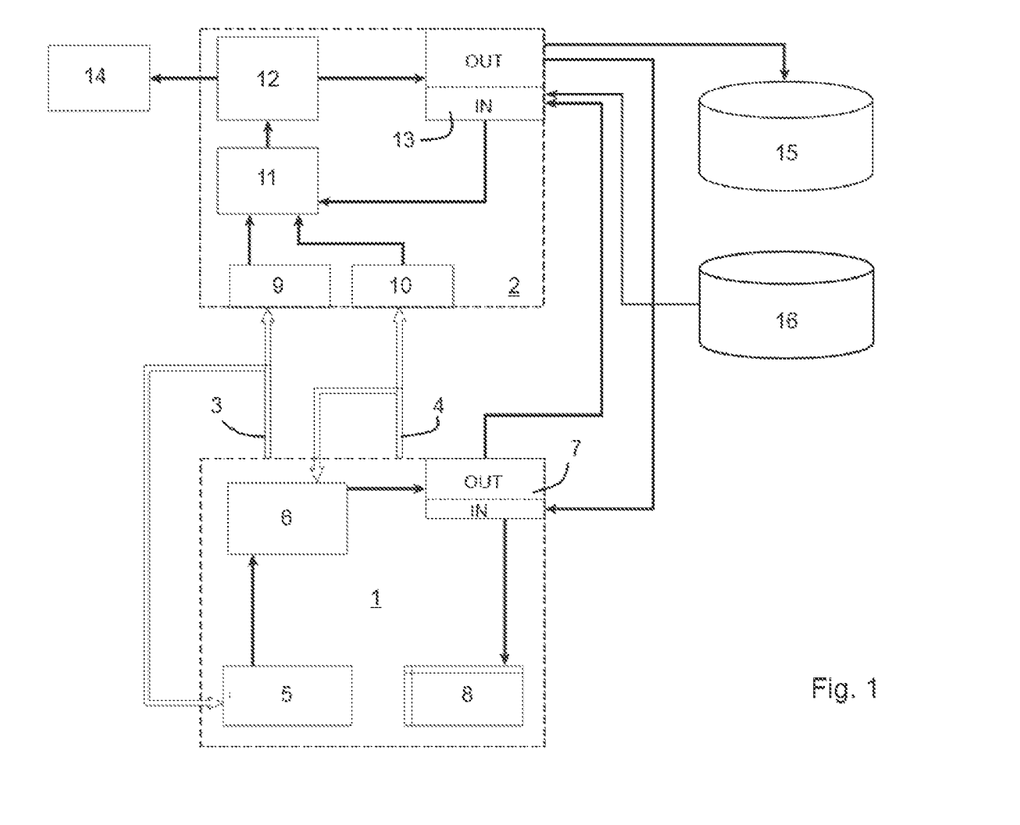
FIG. 1 is a block diagram with a system including an electric motor and a test system, with which parameter data can be transferred to a parameter memory.

FIG. 1 shows a block diagram with a system including an electric motor 1 and a final testing system 2, the components that are most relevant here being shown in FIG. 1. The electric motor is connected to the final test system in order to carry out a test of the electric motor before it is delivered. On the one hand, sensors of the electric motor can be calibrated; on the other hand, parameter data are transferred to a parameter memory.

The electric motor 1 is part of a fan and generates vibrations during operation, which is shown by arrow 3, and a rotational speed, which is shown by arrow 4. The vibrations 3 are measured in at least one direction by an (internal) vibration sensor 5 of the electric motor. The vibration sensor 5 is an example of a sensor that can be used in the method disclosed herein. The measured values determined by the vibration sensor 5 are transferred to a processor 6, which is formed, for example, by a microcontroller. This processor 6 can, for example, carry out an analog-digital conversion and/or control the acquisition of the measured values. The processor 6 can thus determine vibration values from the measured values. In addition, the processor 6 is designed to determine the current rotational speed.

The processor 6 is connected to an interface 7 and an (internal) memory, which is designed as a non-volatile memory and functions as a parameter memory 8. The interface 7 represents a communication connection to the test system 2. Information can be sent to the test system 2 via an output OUT of the interface 7, and information from the test system 2 can be received via an input IN of the interface 7, in which the input channel and the output channel do not necessarily have to be implemented separately from one another, but may also use a common communication line, for example a bus.

The test system 2 includes at least one test sensor 9, a speed sensor 10, a data acquisition unit 11, a processor 12, and an interface 13. The test system is designed, inter alia, to calibrate the vibration sensor 5 using the at least one test sensor 9. The at least one test sensor 9 is designed to measure the vibrations 3 of the electric motor 1. For this purpose, the at least one test sensor 9 is coupled to the electric motor in terms of vibration. The speed sensor 10 measures the current rotational speed 4 of the electric motor 1. Both the test sensor(s) 9 and the speed sensor 10 transfer measured values to the data acquisition unit 11, which in turn can transfer information to the processor 12. The processor 12 is connected to a data output unit 14, via which, for example, a balance display can take place or the results of a final test can be output. The processor is also connected to interface 13 which, like interface 7, includes an input IN and an output OUT. The input IN of interface 13 is connected, in a communicating manner, to the output OUT of interface 7, while the output OUT of interface 13 is connected, in a communicating manner, to the input IN of interface 7. In addition, the input IN of interface 13 is connected to the data acquisition unit 11, and the output OUT of interface 13 is connected to a database 15 which represents a motor database for storing operating parameters of the electric motor 1. At the same time, the input IN of interface 13 is connected to a PPS database 16 (product planning and control) which stores information about the structure and condition of the electric motor 1.

Figure 2:
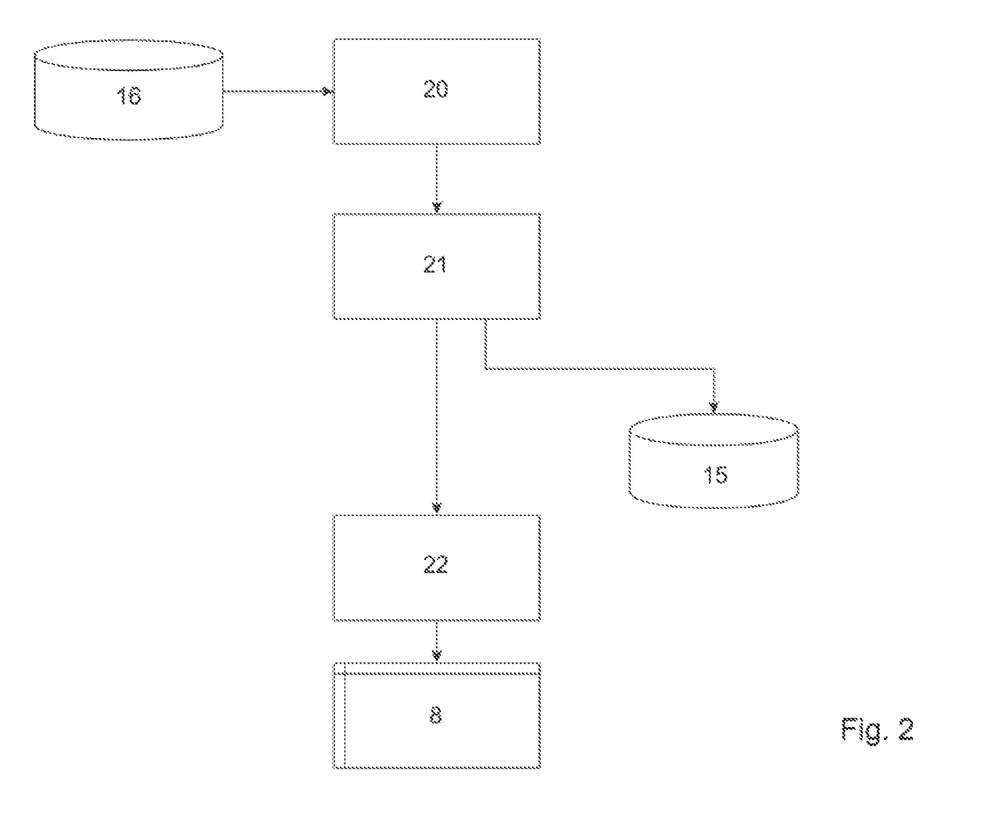
FIG. 2 is a flow chart for storing parameter data in a parameter memory.

FIG. 2 shows a flow chart which indicates, by way of example, the storage of parameter data in the parameter memory 8. In step 20, system-internal characteristics of the fan or its motor or its components are loaded from the PPS database 16. This parameter data can include:

Centers of gravity and masses (e.g. rotor, impeller, stator bushing)
Bearing adjustment forces
Axial thrust-speed characteristic (caused by impeller)
Magnetic attraction between stator and rotor (radial force)
Characteristic data of the bearings and the greasing thereof, possibly including the date of manufacture of the bearings
Maximum permissible imbalance and/or actual residual imbalance from the final test
Additional features of the bearing, e.g. Nilos ring etc., which have an influence on the estimation of the bearing service life
Geometric data of the electric motor or the fan
Permitted or standard installation positions
Maximum permissible speed-vibration value pairs or characteristic curve These or similar parameter data can originate from various sources in the PPS database 16. Thus, it would be conceivable that individual pieces of information come from CAD (Computer Aided Design) data sets. Other information can come from the technical design or from measurements on an identical electric motor. In addition, parameter data can result from the calibration measurements and can also be loaded or collected in step 20.

In step 21, the parameter data that were loaded or collected in step 20 are transferred to interface 13 for parameterization. From there, they are transferred to the database 15 and to interface 7 of the electric motor 1. The database 15 can store a "digital twin" of the electric motor, and the parameter data can be stored there as part of the "digital twin." In step 22, the parameter data that have been transferred to interface 7 are received by the electric motor and stored in the parameter memory 8.

Figure 3:
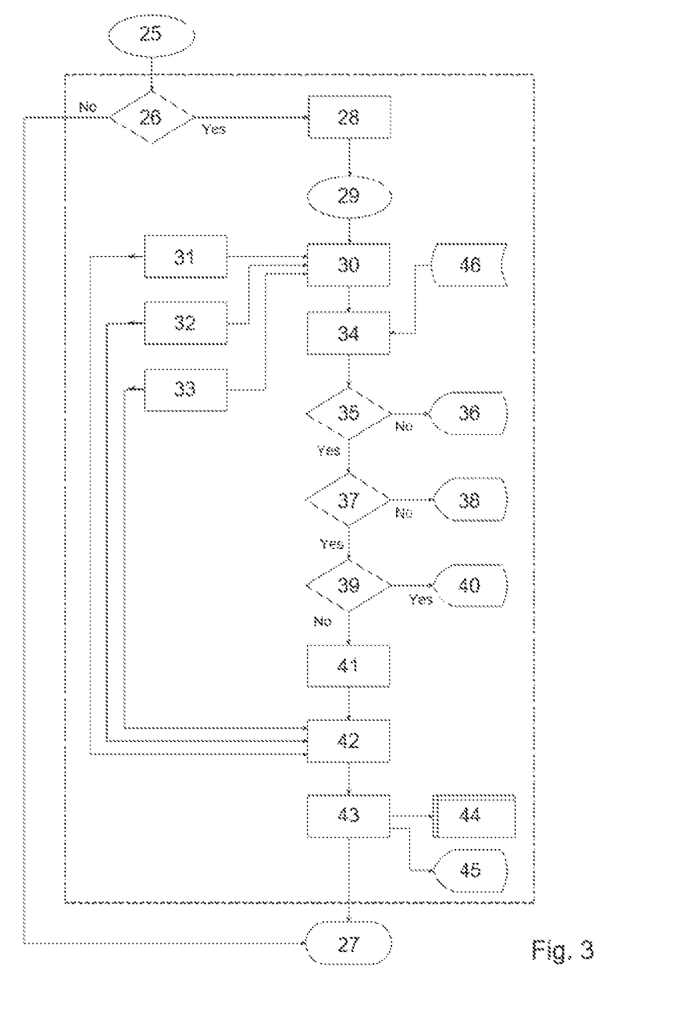
FIG. 3 shows a flow chart of an exemplary embodiment of a method.

FIG. 3 shows a flow chart of an exemplary embodiment of a method that uses this parameter data. In step 25, a supply voltage is applied to the electric motor 1, so that the motor electronics are supplied with energy and started up. In step 26, there is a check as to whether the electric motor is being placed into operation for the first time after the final test. If this question is answered in the negative, there is a change to step 27, in which the process sequence ends. If the question is answered in the affirmative, the actual evaluation process begins with step 28. The commissioning run is started here. In step 29, a run-up process begins, in which the rotational speed of the electric motor is increased in several speed levels, from a speed of zero to a nominal speed.

In step 30, measured values from sensors of the electric motor are collected, which are measured in steps 31, 32, and 33. In step 31, the spatial orientation of the electric motor or its shaft is determined by an inclination measuring unit. In step 32, vibrations of the electric motor are measured by a vibration sensor, and vibration values are determined. In step 33, the rotational speed of the electric motor is determined. In some embodiments, steps 32 and 33 can be carried out for all speed levels, even if the flow chart shows only one run-up for the sake of clarity. In most application scenarios, the installation position can only be measured once, as the installation position should not change.

In step 34, parameter data corresponding to the recorded measured values are loaded from the parameter memory. In the present case, these parameter data are a permissible range of a spatial orientation of the electric motor, a maximum permissible imbalance of the electric motor, a maximum permissible vibration, and vibration values from the final test of the electric motor. This is symbolized by field 46 which represents the parameter data stored in the parameter memory 8.

In step 35, the spatial orientation of the electric motor measured by the inclination measuring unit is compared with the parameter datum "permissible range of spatial orientation," and the measured value of the spatial orientation of the electric motor is thus evaluated. If the measured spatial orientation is outside the permissible range, a warning message is output in step 36, according to which the installation position is outside the permissible range. The procedure can then be canceled. If the measured spatial orientation is within the permissible range, there is a change to step 37.

In step 37, pairs of values from a rotational speed and an associated vibration value are compared with tolerance limits, the tolerance limits being defined by the previously loaded parameter data. If the vibration value is outside the tolerance limits, there is a reaction to this in step 38. On the one hand, a warning message is issued that the vibration value is greater than the maximum permissible vibrations. On the other hand, the rotational speed can be reduced, which should reduce the vibrations. If the vibrations are reduced considerably with a relatively small change in speed, it can be concluded that a resonance point is present. In this case, the procedure can in principle be continued. If the speed reduction does not result in a significant reduction in the vibrations, the process can be terminated completely. The same can be done if the vibration value is significantly above the maximum permissible vibration value.

In step 39, a currently measured vibration value is compared with the vibration values that were carried out during the final test of the electric motor. If the currently measured vibration values are significantly greater than the vibration values from the final test, it is very likely that the electric motor has been damaged or incorrectly installed. When evaluating the currently measured vibration values, the vibrations in the installation environment are also taken into account. For this purpose, vibrations at a speed of zero for the electric motor are recorded and subtracted from the vibration values at a speed not equal to zero. This prevents an incorrect decision due to vibrations from the installation environment. If the vibration values from the calibration measurement are significantly exceeded, it can be indicated in step 40 that transport damage or an assembly fault is very likely. In this case, too, the execution of the further method can be interrupted, so that further damage to the electric motor or the fan can be prevented.

In step 41, the nominal speed of the electric motor is reached, and the run-up process is completed. The forces actually acting on the bearings can then be calculated in step 42. For this purpose, the spatial orientation recorded in step 31, the vibration values recorded in step 32, and the rotational speed recorded in step 33 are processed. In addition, further parameter data are loaded from the parameter memory, which can include, for example, bearing adjustment forces, geometric information on the electric motor, geometric information on the impeller, an axial thrust/speed characteristic curve, and information on the masses of parts of the electric motor.

The bearing service life is then estimated as an initial value in step 43 from the actually acting forces calculated in this way. This can be specified as the nominal bearing service life L10h. This is defined in Standard ISO 281 and indicates the service life that is achieved by 90% of the bearings tested under the same operating conditions. The nominal service life L10h thus stands for a 10 percent failure probability.

In step 44, the initial value of the bearing service life and data that have been obtained over the course of the method are stored in an internal memory of the motor electronics. Furthermore, it is indicated in step 45 that nominal operation has been started. The method then ends in step 27, which represents the nominal operation of the electric motor.

In addition, the measured values obtained during the course of the method and/or the results of the evaluations can be transferred to the database 15. For example, the initial value of the nominal service life L10h and measured values for the vibrations in the installation environment can be transferred to the database and supplement the "digital twin." Additionally or alternatively, it is also conceivable that the information obtained, for example in an industrial 4.0 environment, is sent to a monitoring unit, in which the monitoring unit would monitor safe operation of the electric motor.

With regard to further advantageous embodiments of the method according to various embodiments, reference is made to the general part of the description and to the appended claims in order to avoid repetition.

Finally, it is to be expressly noted that the above-described exemplary embodiments are used solely to explain the claimed teaching, but do not restrict it to the exemplary embodiments.

LIST OF REFERENCE NUMERALS

2 Final test system
3 Vibrations
4 Rotational speed
5 Vibration sensor
6 Processor
7 Interface
8 Parameter memory
9 Test sensor
10 Rotational speed sensor
11 Data acquisition unit
12 Processor
13 Interface
14 Data output unit
15 Database
16 PPS database

The invention claimed is:

1. A method for evaluating the operational readiness of an electric motor, the method comprising:
    initiating a run-up process wherein the electric motor speed is changed between a plurality of speed levels;
    generating at least one measured value by measuring a physical variable of the electric motor with a sensor during at least one of the speed levels wherein during generating the at least one measured value one or more of an acceleration and a speed of vibration of the electric motor is measured using a vibration sensor of the electric motor and a vibration value is generated;
    loading at least one parameter datum from a parameter memory of the electric motor, wherein the at least one parameter datum corresponds to the generated at least one measured value;
    evaluating the at least one measured value for at least one of the speed levels using the at least one loaded parameter datum; and
    determining a first vibration value while the electric motor is stopped and determining a second vibration value at a non-zero speed, wherein damage is determined to be present if a difference between the second vibration value and the first vibration value exceeds a calibration vibration value by a predetermined degree, the calibration vibration value being generated during a calibration measurement of the electric motor for the non-zero speed.

2. The method of claim 1, wherein the run-up process comprises increasing the speed level from a lower speed to an upper speed of the electric motor.

3. The method of claim 1, further comprising determining whether the electric motor speed has reached a set speed level prior to generating the at least one measured value.

4. The method of claim 1, wherein the act of evaluating the at least one measured value comprises:
    determining whether the at least one measured value is compliant with a boundary condition; and
    outputting a warning message if the at least one measured value boundary condition is not compliant with the boundary condition.

5. The method of claim 1, further comprising estimating a bearing service life while performing at least one of loading the parameter data and measuring the measured values.

6. The method of claim 1, wherein the at least one parameter datum comprises one or more of:
reference values;
design information about the electric motor;
design information about a load operated by the electric motor;
characteristics of the electric motor;
characteristics of components of the electric motor; and
information about the operating behavior of the electric motor.

7. The method of claim 1, wherein generating at least one measured value, loading at least one parameter datum, and evaluating the at least one measured value are carried out for each of the speed levels.

8. The method of claim 1, wherein the vibration value is generated at zero speed.

9. The method of claim 1, wherein loading at least one parameter datum comprises loading a maximum permissible vibration, and evaluating the at least one measured value comprises comparing the maximum permissible vibration with the generated vibration value.

10. The method of claim 1, wherein the at least one parameter datum comprises loading a calibration vibration value for a current electric motor, and wherein evaluating evaluating the at least one measured value comprises comparing the calibration value with the generated vibration value.

11. The method of claim 1, wherein generating the at least one measured value comprises measuring a spatial orientation of the electric motor.

12. The method of claim 11, wherein loading the at least one parameter datum comprises loading a permissible range of the spatial orientation of the electric motor, and evaluating the at least one measured value comprises determining whether the spatial orientation is within the permissible range.

13. An electric motor configured to carry out the method of claim 1, the electric motor comprising:
an impeller and a rotor, wherein the impeller is connected to the rotor; and
a parameter memory and an interface for transferring parameter data, wherein the parameter memory is configured to store parameter data transferred via the interface during a parameterization process, wherein the at least one parameter datum comprises one or more of:
a maximum permissible imbalance of a fan;
geometric data for the impeller;
information about a design of the impeller; and
an axial thrust-speed characteristic.

14. The electric motor of claim 13, wherein the at least one parameter datum comprises one or more of:
a center of gravity of the electric motor or parts of the electric motor;
a mass of the electric motor or parts of the electric motor;
bearing adjustment forces;
characteristic data of the bearing;
a maximum permissible imbalance of the electric motor;
geometric data of the electric motor;
a permissible range of spatial orientations of the electric motor;
a maximum permissible speed of the electric motor; and
a characteristic curve of a magnetic attraction between a stator and a rotor of the electric motor.

15. A method for evaluating the operational readiness of an electric motor, the method comprising:
initiating a run-up process wherein the electric motor speed is changed between a plurality of speed levels;
generating at least one measured value by measuring a physical variable of the electric motor with a sensor during at least one of the speed levels, wherein generating the at least one measured value includes measuring a spatial orientation of the motor;
loading at least one parameter datum from a parameter memory of the electric motor, wherein the at least one parameter datum corresponds to the generated at least one measured value, wherein the act of loading the at least one parameter datum comprises loading a permissible range of the spatial orientation of the electric motor; and
evaluating the at least one measured value for at least one of the speed levels using the at least one loaded parameter datum, wherein the act of evaluating the at least one measured value comprises determining whether the spatial orientation is within the permissible range.

16. The method of claim 15, wherein the run-up process comprises increasing the speed level from zero speed to an operational speed of the electric motor.

17. The method of claim 15, further comprising determining whether the electric motor speed has reached a set speed level prior to generating the at least one measured value.

18. The method of claim 15, wherein the act of evaluating the at least one measured value comprises:
determining whether the at least one measured value is compliant with a boundary condition; and
outputting a warning message if the at least one measured value boundary condition is not compliant with the boundary condition.

19. The method of claim 15, further comprising estimating a bearing service life while performing at least one of loading the parameter data and measuring the measured values.

20. The method of claim 15, wherein the at least one parameter datum comprises one or more of:
reference values;
design information about the electric motor;
design information about a load operated by the electric motor;
characteristics of the electric motor;
characteristics of components of the electric motor; and
information about the operating behavior of the electric motor.

21. The method of claim 15, wherein the acts of generating at least one measured value, loading at least one parameter datum, and evaluating the at least one measured value are carried out for each of the speed levels.

22. An electric motor configured to carry out the method of claim 15, the electric motor comprising:
an impeller and a rotor, wherein the impeller is connected to the rotor; and
a parameter memory and an interface for transferring parameter data, wherein the parameter memory is configured to store parameter data transferred via the interface during a parameterization process, wherein the at least one parameter datum comprises one or more of:
a maximum permissible imbalance of a fan;
geometric data for the impeller;
information about a design of the impeller; and
an axial thrust-speed characteristic.

23. The electric motor of claim 22, wherein the at least one parameter datum comprises one or more of:
- a center of gravity of the electric motor or parts of the electric motor;
- a mass of the electric motor or parts of the electric motor;
- bearing adjustment forces;
- characteristic data of the bearing;
- a maximum permissible imbalance of the electric motor;
- geometric data of the electric motor;
- a permissible range of spatial orientations of the electric motor;
- a maximum permissible speed of the electric motor; and
- a characteristic curve of a magnetic attraction between a stator and a rotor of the electric motor.

* * * * *